(12) United States Patent
Van Goor et al.

(10) Patent No.: US 8,729,975 B2
(45) Date of Patent: May 20, 2014

(54) IMPLEMENTING DIFFERENTIAL RESONANT CLOCK WITH DC BLOCKING CAPACITOR

(75) Inventors: Kenneth A. Van Goor, Fall Creek, WI (US); David I. Sanderson, Folsom, CA (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 13/215,795

(22) Filed: Aug. 23, 2011

(65) Prior Publication Data

US 2013/0049840 A1 Feb. 28, 2013

(51) Int. Cl.
*H03B 5/08* (2006.01)

(52) U.S. Cl.
USPC .......................................... 331/167

(58) Field of Classification Search
USPC ............................ 331/55, 117 FE, 117 R, 167
See application file for complete search history.

(56) References Cited

U.S. PATENT DOCUMENTS

| 6,639,477 | B2 * | 10/2003 | van Roosmalen et al. ...... 331/76 |
| 6,701,474 | B2 * | 3/2004 | Cooke et al. ................... 714/724 |
| 7,880,551 | B2 | 2/2011 | Chan et al. |
| 8,035,456 | B1 * | 10/2011 | Jang et al. ................ 331/117 FE |
| 8,049,302 | B2 * | 11/2011 | Darabi et al. .................. 257/532 |
| 8,102,216 | B1 * | 1/2012 | Kaczynski .............. 331/117 FE |
| 2009/0322446 | A1 * | 12/2009 | Daley et al. .................... 333/185 |
| 2011/0084736 | A1 | 4/2011 | Papaefthymiou et al. |
| 2011/0084772 | A1 | 4/2011 | Papaefthymiou et al. |
| 2011/0084773 | A1 | 4/2011 | Papaefthymiou et al. |
| 2011/0084774 | A1 | 4/2011 | Papaefthymiou et al. |
| 2011/0090018 | A1 | 4/2011 | Papaefthymiou et al. |
| 2011/0090019 | A1 | 4/2011 | Papaefthymiou et al. |

FOREIGN PATENT DOCUMENTS

| WO | WO2011046974 A2 | 4/2011 |
| WO | WO2011046977 A2 | 4/2011 |
| WO | WO2011046979 A2 | 4/2011 |
| WO | WO2011046984 A2 | 4/2011 |
| WO | WO2011046985 A2 | 4/2011 |

OTHER PUBLICATIONS

Chan et al., "Distributed Differential Oscillators for Global Clock Networks", JSSC vol. 41, No. 9, Sep. 2006, pp. 2083-2094.
Zhang, et al "Injection-Locked Clocking: A New Ghz Clock Distribution Scheme", CICC, 2006, pp. 785-788.

* cited by examiner

*Primary Examiner* — Levi Gannon
(74) *Attorney, Agent, or Firm* — Joan Pennington

(57) ABSTRACT

A method and circuit for implementing differential resonant clocking with a DC blocking capacitor, and a design structure on which the subject circuit resides are provided. An on-chip inductor and an on-chip capacitor are connected between a pair of differential active clock load nodes to form a resonant tank circuit. The on-chip inductor has a selected value based upon a value of a load capacitor of the differential active clock load nodes to determine the resonant frequency. The on-chip capacitor has a selected value substantially greater than the value of the load capacitor.

13 Claims, 4 Drawing Sheets

PRIOR ART

IMPLEMENTING DIFFERENTIAL RESONANT CLOCK WITH DC BLOCKING CAPACITOR

FIELD OF THE INVENTION

The present invention relates generally to the data processing field, and more particularly, relates to a method and circuit for implementing differential resonant clocking with a DC blocking capacitor, and a design structure on which the subject circuit resides.

DESCRIPTION OF THE RELATED ART

Clock distribution for high speed serial input/output (I/O) requires a significant amount of power. Large complementary metal oxide semiconductor (CMOS) or current mode logic (CML) buffers drive long on-chip transmission line structures to deliver low-jitter, high frequency clocks to serializers, deserializers, and other signal processing circuits.

The power required for CMOS clock distribution generally follows the equation $P=f*C*V^2$, where C is the capacitive load on the clock buffer, V is the supply voltage, and f is the frequency of operation. Thus, power increases linearly with clock frequency for faster serial I/O communication. Capacitance can also increase moving to new technology nodes with metal gates and thinner oxides, as well as back-end of the line (BEOL) metal with smaller dielectric thickness.

Using CMOS buffers for clock distribution is limited by jitter and duty cycle. Improving signal quality delivered by a CMOS buffer requires more power to decrease the rise and fall times of the clock edges. Faster edge rates improve duty cycle and jitter by reducing the time spent near the switch point of the inverter where the inverter is most sensitive to small variations in voltage level. As capacitive loads increase, keeping edge rates sharp becomes more difficult and requires more power.

An alternative is to use CML buffers to distribute high-speed clocks. CML is inherently better than CMOS at delivering low jitter and low duty cycle error signals because of the high gain response of differential pair buffers. However, CML rise times can get slow due to large RC time constants. The major difference in RC time constant between CMOS and CML buffers is the load resistors used by the differential pair to set a voltage swing. These load resistors can be several ohms, depending on the size of the current source. When the RC time constant gets too large for the frequency of operation, the signal amplitude becomes compressed and can become a problem for the circuits using the delivered clock.

Referring to FIG. 1, there is shown a prior art clock distribution technique including an added inductor L in parallel with the load capacitance $C_{LOAD}$ to form an LC resonant tank. The shunt inductor L will resonate with the load capacitance $C_{LOAD}$ from the transmission line and the clock gate area load at the tuned frequency band.

The energy used to charge the load capacitance $C_{LOAD}$ for a portion of the clock cycle then energizes the inductor L for the other portion of the clock cycle. A standard CMOS buffer driving the LC tank at the designed resonant frequency replenishes the energy lost in the tank and controls the resulting phase and amplitude of the desired clock signal.

With the inductor capacitor (LC) resonant tank illustrated in FIG. 1, for DC testing, the two phases $CLK_{OUT}$ and $CLK_{OUT\_B}$ of the clock would be shorted together. Typical integrated circuits require low frequency switching in order to perform DC stuck-at-fault manufacturing testing. To solve this problem, the inductor is switched out with analog transmission gates during DC stuck-at-fault testing.

Lossy field effect transistor (FET) switches can be added to take the inductor out of operation for DC testing. The drawback to this solution is it adds resistance in series with the inductor and lowers the quality factor of the resonator.

Advantages of using an inductor to resonate with the clock load capacitance include reduced power to drive the clock load, improved power supply jitter and reduced duty cycle distortion.

A need exists for an effective mechanism for implementing differential resonant clocking. It is desirable to provide such mechanism to allow for effective low frequency and resonant frequency operation.

SUMMARY OF THE INVENTION

Principal aspects of the present invention are to provide a method and circuit for implementing differential resonant clocking with a DC blocking capacitor, and a design structure on which the subject circuit resides. Other important aspects of the present invention are to provide such method, circuit, and design structure substantially without negative effects and to overcome many of the disadvantages of prior art arrangements.

In brief, a method and circuit for implementing differential resonant clocking with DC blocking, and a design structure on which the subject circuit resides are provided. An on-chip inductor and an on-chip capacitor are connected between a pair of differential active clock load nodes forming a resonant tank circuit. The on-chip inductor has a selected value based upon a value of a load capacitor of the differential active clock load nodes to determine the resonant frequency. The on-chip capacitor has a selected value substantially greater than the value of the load capacitor.

In accordance with features of the invention, the on-chip inductor is a back-end-of-line (BEOL) inductor, and the on-chip capacitor is a back-end-of-line (BEOL) capacitor.

In accordance with features of the invention, the on-chip inductor includes two coils, such as concentric coils, with one coil connected to the true clock node and the other coil connected to the compliment node.

In accordance with features of the invention, the on-chip capacitor effectively creates an open at DC, allowing for DC testing without requiring added switches to take the shunt on-chip inductor out of operation for DC testing. The on-chip capacitor is, for example, a metal comb capacitor. The metal capacitor is connected in series between the two coils.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing differential resonant clocking with DC blocking, and a design structure on which the subject circuit resides are provided. The differential resonant clocking circuit of the invention eliminates the need for switches to take a shunt inductor out of operation for DC testing.

Figure 1:
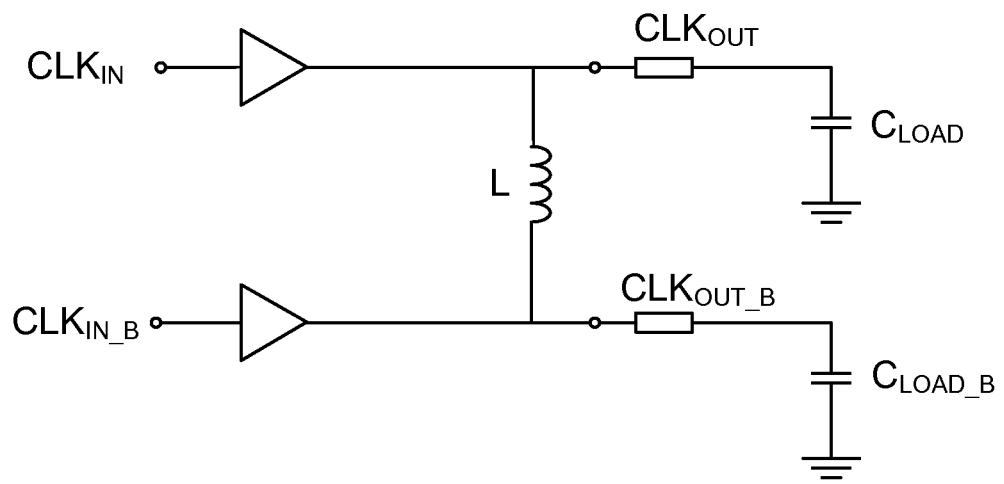
FIG. 1 is a schematic diagram illustrating a prior art shunt inductor for implementing a prior art clock distribution technique.
Figure 2:
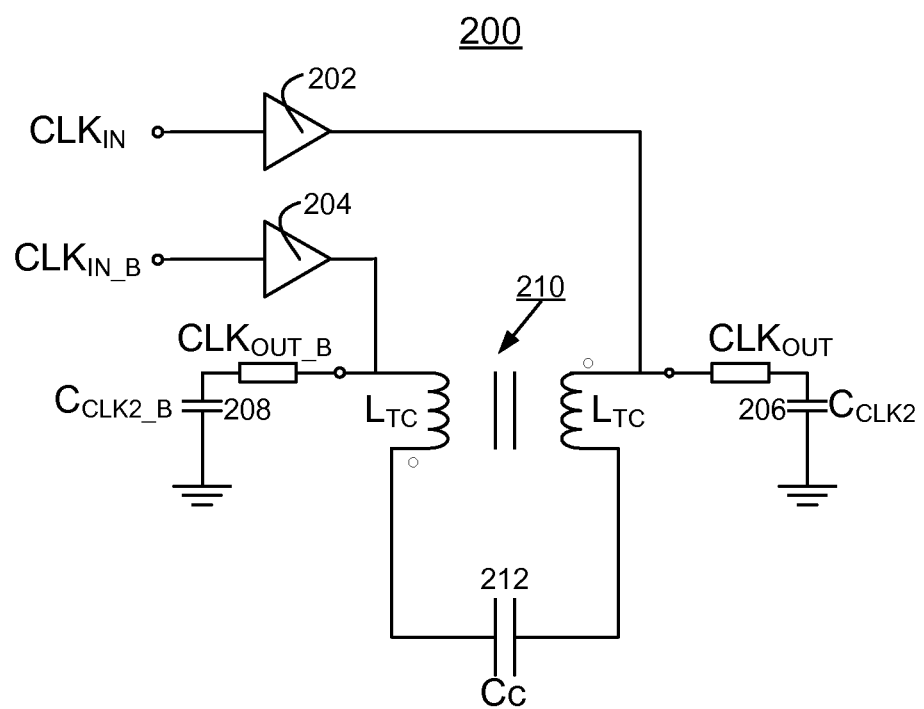
FIG. 2 schematically illustrates an exemplary circuit for implementing differential resonant clocking with a DC blocking capacitor in accordance with the preferred embodiment.

Having reference now to the drawings, in FIG. 2, there is shown an exemplary circuit generally designated by the reference character 200 for implementing differential resonant clocking in accordance with the preferred embodiment. The differential resonant clocking circuit 200 includes a pair of buffers 202, 204 coupling a pair of differential clock inputs $CLK_{IN}$, $CLK_{IN\_B}$ to a pair of differential active clock load nodes labeled $CLK_{OUT}$, $CLK_{OUT\_B}$. A respective load capacitor $C_{CLK2}$, 206, $C_{CLK2\_B}$, 208 is shown with the differential active clock load nodes $CLK_{OUT}$, $CLK_{OUT\_B}$.

The respective load capacitor $C_{CLK2}$, 206, $C_{CLK2\_B}$, 208 represents the active load of the differential active clock load nodes $CLK_{OUT}$, $CLK_{OUT\_B}$ and includes transmission line capacitance of the distribution network and gate load capacitance of the clocked circuits.

In accordance with features of the invention, in order to form a resonant tank with the active clock load providing the capacitance of the tank, a back-end-of-line (BEOL) inductor $L_{TC}$ and a back-end-of-line (BEOL) capacitor $C_C$ are connected between the active clock load nodes.

The differential resonant clocking circuit 200 includes an on-chip inductor $L_{TC}$ generally designated by reference character 210 and an on-chip capacitor $C_C$ 212 connected between a pair of differential active clock load nodes labeled $CLK_{OUT}$, $CLK_{OUT\_B}$ forming a resonant tank circuit.

The on-chip inductor $L_{TC}$, 210 has a selected value based upon a value of the load capacitor $C_{CLK2}$, 208 of the differential active clock load nodes to determine the resonant frequency. The on-chip capacitor $C_C$, 212 has a selected value substantially greater than the value of the load capacitor. For example, the on-chip capacitor $C_C$, 212 has a selected value at least three times greater than the value of the load capacitor.

In accordance with features of the invention, the on-chip capacitor $C_C$ 212 effectively creates an open at DC, allowing for DC testing without adding switches to the shunt on-chip inductor $L_{TC}$, 210. The on-chip capacitor is, for example, a metal comb capacitor. The metal capacitor is connected in series between the two coils.

The on-chip inductor $L_{TC}$, 210 advantageously is a back-end-of-line (BEOL) inductor, and the on-chip capacitor $C_C$, 212 is a back-end-of-line (BEOL) capacitor. The integration of on-chip capacitor $C_C$, 212 and inductor $L_{TC}$, 210 advantageously is accomplished by introducing these passive devices into one or more of the metallization levels of the back-end-of-line (BEOL) wiring structure, which are used to electrically connect the active devices fabricated using the semiconductor substrate during front-end-of-line (FEOL) processing. A popular method of forming a BEOL wiring structure is a dual damascene process in which vias and trenches in various dielectric layers are filled with metal in the same process step to create multi-level, high density metal interconnections.

U.S. Pat. No. 7,811,919 to Daley et al, issued Oct. 12, 2010, entitled "Methods of fabricating a BEOL wiring structure containing an on-chip inductor and an on-chip capacitor" and assigned to the present assignee, discloses back-end-of-line (BEOL) wiring structures that include an on-chip inductor and an on-chip capacitor. The on-chip inductor and an on-chip capacitor, which are fabricated as conductive features in different metallization levels, are vertically aligned with each other. The on-chip capacitor, which is located between the on-chip inductor and the substrate, may serve as a Faraday shield for the on-chip inductor.

Both inductor $L_{TC}$, 210 and capacitor $C_C$, 212 advantageously are implemented or fabricated by the back-end-of-line (BEOL) wiring structures that include an on-chip inductor and an on-chip capacitor as disclosed in the above-identified U.S. Pat. No. 7,811,919. The subject matter of the above-identified U.S. Pat. No. 7,811,919 is incorporated herein by reference in its entirety.

The on-chip inductor $L_{TC}$, 210 includes two coils, such as concentric coils, with one coil connected to the true clock node $CLK_{OUT}$ and the other coil connected to the compliment node $CLK_{OUT\_B}$, as shown in FIG. 2 and illustrated and disclosed in U.S. Pat. No. 7,811,919. The series capacitor $C_C$, 212 creates an open at DC, enabling DE testing while eliminating lossy field effect transistor (FET) switches often used with a convention tank circuit to take the inductor out of operation for DC testing. The series capacitor $C_C$, 212 saves area for the series capacitor, because it doubles as a ground shield under the coils of on-chip inductor $L_{TC}$, 210.

Figure 3:
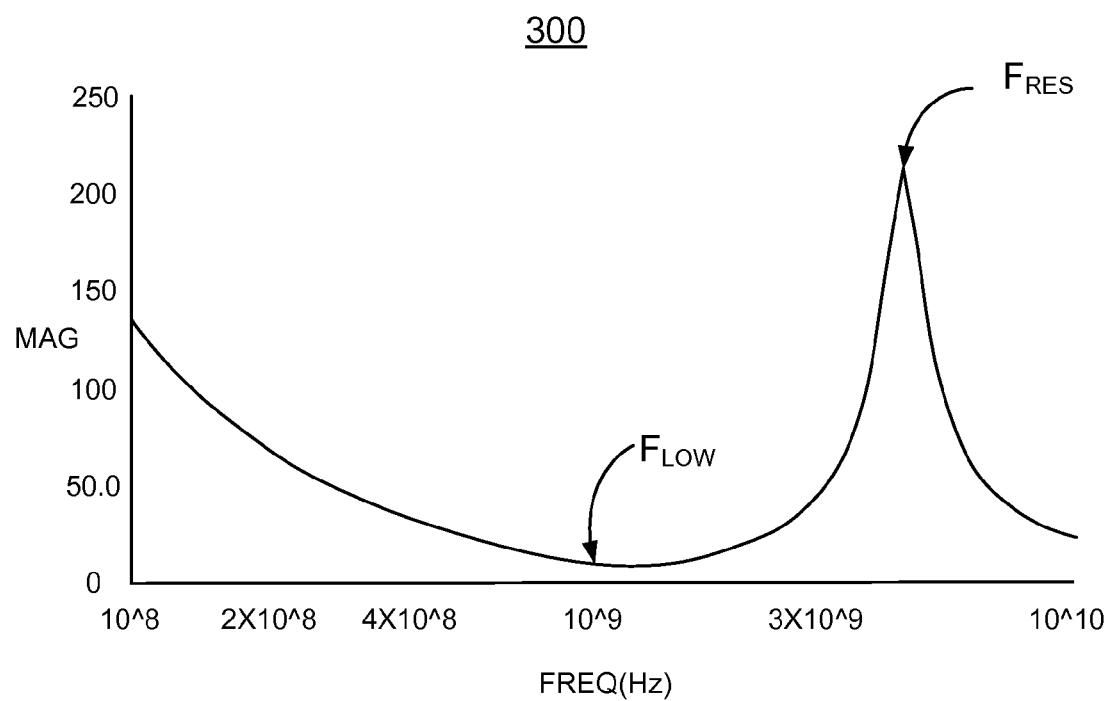
FIG. 3 illustrates example operations of the circuit of FIG. 2 implementing differential resonant clocking with DC blocking with an example waveform not to scale in accordance with the preferred embodiment.

Referring also to FIG. 3, there are shown example frequency response operations generally designated by the reference character 300 of the circuit 200 implementing differential resonant clocking with DC blocking with an example waveform not to scale in accordance with the preferred embodiment. The example frequency response operations 300 for the combination of the inductor $L_{TC}$, 210 and capacitor $C_C$, 212 as shown include a resonant frequency $F_{RES}$, at the peak at 4.3 GHz, which the point where the impedance of the inductor $L_{TC}$, 210 most closely balances out the load impedance of the load capacitor $C_{CLK}2$, 208. This is the frequency point where the clock distribution most efficiently transfers energy from the inductor $L_{TC}$, 210 to the clock distribution load capacitance $C_{CLK}2$, 208. Moving left on the graph from the resonant point, which is lower in frequency $F_{LOW}$, the impedance of the inductor $L_{TC}$, 210 and capacitor $C_C$, 212 prevent signals from passing through the network. As the frequency of the clock signal is reduced closer to DC, a point in the spectrum is reached where the impedance of capacitor $C_C$, 212 prevents the BEOL inductor $L_{TC}$, 210 from shorting the differential clock signals. The point generally indicated by frequency $F_{LOW}$ is where the magnitude response starts to increase as it approaches DC at the far left of the graph. This double peak in magnitude response allows the driving clock buffer 202, 204 to also operate at a low frequency. The operation at a low frequency permits DC stuck-at-fault testing of the clock network without additional resistance in series with the inductor $L_{TC}$, 210 for analog switching devices conventionally required with conventional inductor tank circuits.

It should be understood that the scope of the present invention is not limited to the illustrated example operations 300 and illustrated frequencies, for example various other resonant frequencies can be implemented based upon the value of the inductor $L_{TC}$.

In accordance with features of the invention, the differential resonant clocking circuit 200 uses substantially less power as compared to conventional CMOS clocking arrangement while maintaining a high quality clock signal. The differential resonant clocking circuit 200 includes BEOL characteristics of the inductor tank circuit which vary less that field effect transistor (FET) switches to mitigate process sensitivity. Energy of the tank circuit formed by inductor $L_{TC}$, 210 and capacitor $C_C$, 212 of the differential resonant clocking circuit 200 versus energy from the supply mitigates supply noise sensitivity. Magnetic coupling of the true clock signal to the compliment clock signal mitigates duty cycle distortion in the differential resonant clocking circuit 200.

Figure 4:
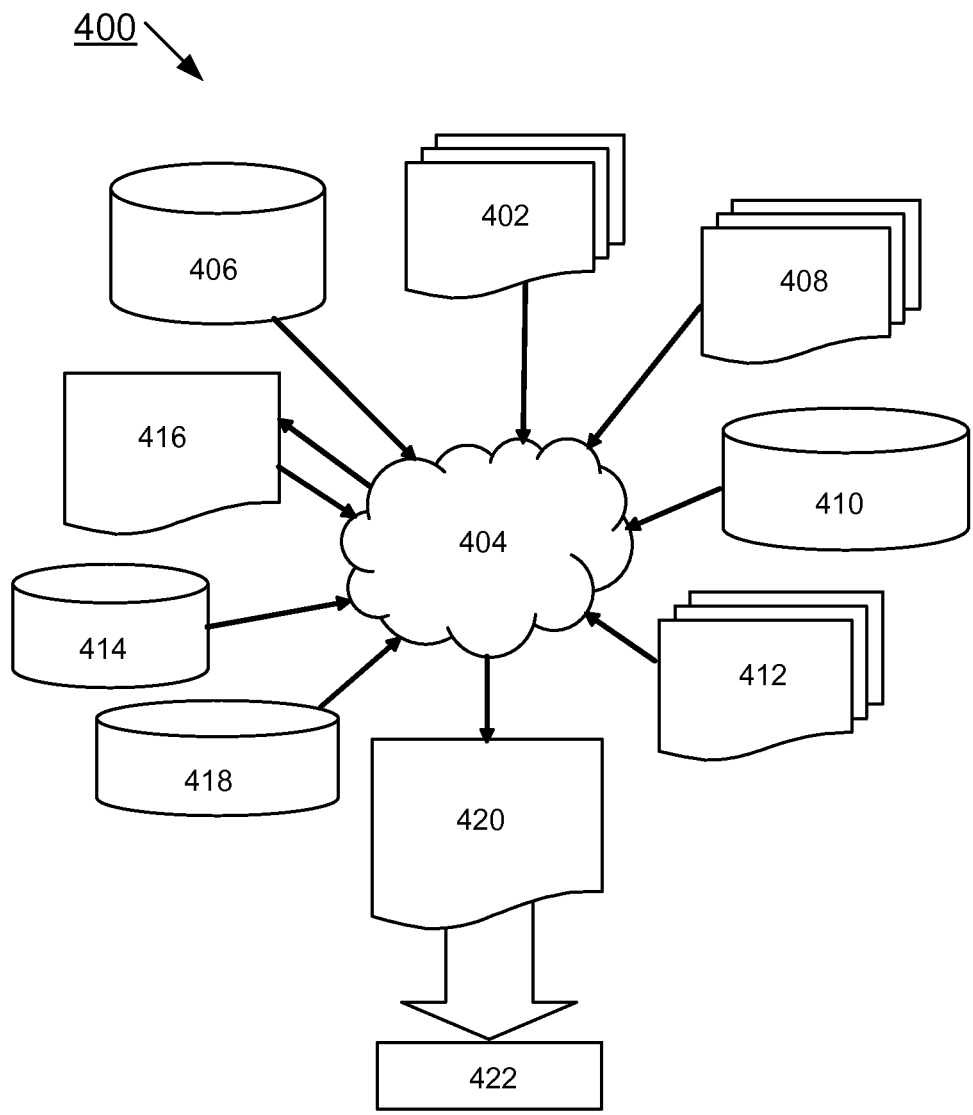
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 200, in the form of schematics or HDL, a hardware-description language, for example, Verilog, VHDL, C, and the like. Design structure 402 may be contained on one or more machine readable medium. For example, design structure 402 may be a text file or a graphical representation of circuit 200. Design process 404 preferably synthesizes, or translates, circuit 200, into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 2 and 3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2 and 3. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing differential resonant clocking with DC blocking comprising:
   an on-chip inductor;
   a series connected on-chip capacitor connected to said on-chip inductor;
   said on-chip inductor together with said on-chip capacitor connected between a pair of differential active clock load nodes forming a resonant tank circuit; said on-chip inductor having a selected value based upon a value of a load capacitor of the differential active clock load nodes to determine a resonant frequency;
   said on-chip capacitor having a selected value greater than the value of said load capacitor;
   said on-chip capacitor providing an input and output blocking capacitor at DC to provide a DC testable resonant tank circuit between differential clock inputs and said pair of differential active clock load nodes with said on-chip capacitor providing DC isolation;
   energy of said resonant tank circuit formed by said on-chip inductor and said on-chip capacitor mitigating supply noise sensitivity; and
   magnetic coupling between said pair of differential active clock load nodes of a true clock signal to a compliment clock signal mitigating duty cycle distortion in the differential resonant clocking circuit.

2. The circuit as recited in claim 1 wherein said on-chip capacitor has a selected value at least three times greater than the value of said load capacitor.

3. The circuit as recited in claim 1 wherein said wherein said on-chip inductor is a back-end-of-line (BEOL) inductor and said on-chip capacitor is a back-end-of-line (BEOL) capacitor.

4. The circuit as recited in claim 1 wherein said on-chip inductor includes two coils, with one coil connected to a true clock node and the other coil connected to a compliment clock node of said pair of differential active clock load nodes.

5. The circuit as recited in claim 4 wherein said on-chip capacitor is connected in series between the two coils.

6. The circuit as recited in claim 5 wherein said two coils are concentric coils, and said on-chip capacitor is located in a space proximate said concentric coils.

7. The circuit as recited in claim 1 wherein said on-chip capacitor is a metal comb capacitor.

8. The circuit as recited in claim 1 wherein said on-chip capacitor effectively creates an open at DC, allowing for DC testing without requiring switches to the shunt on-chip inductor.

9. A method for implementing differential resonant clocking with DC blocking comprising:
providing an on-chip inductor;
providing a series connected on-chip capacitor connected to said on-chip inductor;
forming a resonant tank circuit with said on-chip inductor and said on-chip capacitor connected between a pair of differential active clock load nodes;
providing said on-chip inductor having a selected value based upon a value of a load capacitor of the differential active clock load nodes to determine a resonant frequency;
providing said on-chip capacitor having a selected value greater than the value of said load capacitor;
providing a DC testable resonant tank circuit between differential clock inputs and said pair of differential active clock load nodes with said on-chip capacitor providing an input and output blocking capacitor at DC with said on-chip capacitor providing DC isolation;
mitigating supply noise sensitivity by energy of said resonant tank circuit formed by said on-chip inductor and said on-chip capacitor; and
mitigating duty cycle distortion in the differential resonant clocking circuit by magnetic coupling between said pair of differential active clock load nodes of a true clock signal to a compliment clock signal.

10. The method as recited in claim 9 wherein providing said on-chip inductor includes providing a back-end-of-line (BEOL) inductor and wherein providing said series connected on-chip capacitor connected to said on-chip inductor includes providing a back-end-of-line (BEOL) capacitor.

11. The method as recited in claim 10 wherein providing said on-chip capacitor having a selected value greater than the value of said load capacitor includes providing said on-chip capacitor having a selected value at least three times greater than the value of said load capacitor.

12. The method as recited in claim 11 includes implementing said on-chip inductor including two coils, with one coil connected to a true clock node and the other coil connected to a compliment clock node of said pair of differential active clock load nodes.

13. The method as recited in claim 12 includes said on-chip capacitor in series between said two coils.

* * * * *